United States Patent
Yeh et al.

(10) Patent No.: US 9,923,564 B2
(45) Date of Patent: Mar. 20, 2018

(54) CLOCK DATA RECOVERY APPARATUS AND METHOD CAPABLE OF REDUCING MORE NOISE AS WELL AS TRACKING LARGER FREQUENCY OFFSETS

(71) Applicant: MEDIATEK INC., Hsin-Chu (TW)

(72) Inventors: Tse-Hsien Yeh, New Taipei (TW); Yi-Hsien Cho, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/262,014

(22) Filed: Sep. 12, 2016

(65) Prior Publication Data
US 2017/0141779 A1 May 18, 2017

Related U.S. Application Data

(60) Provisional application No. 62/256,144, filed on Nov. 17, 2015.

(51) Int. Cl.
| | |
|---|---|
| *H03L 7/08* | (2006.01) |
| *H03L 7/081* | (2006.01) |
| *H03L 7/093* | (2006.01) |
| *H04L 7/033* | (2006.01) |

(52) U.S. Cl.
CPC .......... *H03L 7/0807* (2013.01); *H03L 7/0814* (2013.01); *H03L 7/093* (2013.01); *H04L 7/033* (2013.01)

(58) Field of Classification Search
CPC ....... H03L 7/0807; H03L 7/091; H03L 7/085; H03L 7/093; H03L 7/0814; H04L 7/0331; H04L 7/033
See application file for complete search history.

(56) References Cited

U.S. PATENT DOCUMENTS

| | | | |
|---|---|---|---|
| 6,259,755 B1 * | 7/2001 | O'Sullivan | H03L 7/087 370/503 |
| 6,831,523 B1 * | 12/2004 | Pastorello | H03L 7/085 331/1 A |
| 7,720,160 B1 | 5/2010 | Gorecki | |
| 9,344,271 B1 * | 5/2016 | Dusatko | H04L 7/0331 |

(Continued)

FOREIGN PATENT DOCUMENTS

WO     0205429 A2    1/2002

OTHER PUBLICATIONS

Michael H. Perrott, Yunteng Huang, Rex T. Baird, Bruno W. Garlepp, Douglas Pastorello, Eric T. King, Qicheng Yu, Dan B. Kasha, Philip Steiner, Ligang Zhang, Jerrell Hein, and Bruce Del Signore, "A 2.5Gb/s Multi-Rate 0,25μm CMOS CDR utilizing a Hybrid Analog/Digital Loop Filter", ISSSCC 2006, Feb. 2006, IEEE.*

(Continued)

*Primary Examiner* — Aristocratis Fotakis
(74) *Attorney, Agent, or Firm* — Winston Hsu

(57) ABSTRACT

A clock data recovery apparatus includes an oscillator, a sampler circuit, and a frequency control circuit. The oscillator generates a clock signal according to a bias voltage. The sampler circuit samples an input data signal to generate a sampling signal according to the clock signal. The frequency control circuit generates the bias voltage by performing integration calculation, digital-to-analog conversion, and low-pass filtering for the sampling signal.

8 Claims, 2 Drawing Sheets

(56) References Cited

U.S. PATENT DOCUMENTS

| | | | | |
|---|---|---|---|---|
| 2002/0140513 A1* | 10/2002 | Maneatis | ............... | G05F 3/262 331/45 |
| 2003/0020640 A1* | 1/2003 | Perrott | ................... | H03L 7/085 341/61 |
| 2004/0135640 A1* | 7/2004 | Maneatis | ............... | G05F 3/262 331/16 |
| 2007/0206711 A1 | 9/2007 | Aziz | | |
| 2008/0080656 A1* | 4/2008 | Wilson | ................... | H03L 7/091 375/376 |
| 2011/0221489 A1* | 9/2011 | Tarng | ..................... | H03L 7/087 327/156 |
| 2012/0109356 A1* | 5/2012 | Kong | ..................... | H04L 7/033 700/121 |
| 2017/0063386 A1* | 3/2017 | Hiraku | ................... | H03L 7/095 |

OTHER PUBLICATIONS

Michael H. Perrott, Yunteng Huang, Rex T. Baird, Bruno W. Garlepp, Ligang Zhang, Jerrell P. Hein, A 2.5Gb/s Multi-Rate 0.25μm CMOS CDR Utilizing a Hybrid Analog/Digital Loop Filter, Feb. 7, 2006, pp. 1-10, ISSCC 2006 Session 18 Clock and Data Recovery 18.2, IEEE International Solid-State Circuits Conference, USA.

Wenjing Yin et al., A TDC-Less 7 mW 2.5 Gb/s Digital CDR With Linear Loop Dynamics and Offset-Free Data Recovery, IEEE Journal of Solid-State Circuits, vol. 46, No. 12, Dec. 2011, pp. 3163-3173, XP011379221.

\* cited by examiner

CLOCK DATA RECOVERY APPARATUS AND METHOD CAPABLE OF REDUCING MORE NOISE AS WELL AS TRACKING LARGER FREQUENCY OFFSETS

CROSS REFERENCE TO RELATED APPLICATIONS

This application claims priority of U.S. provisional application Ser. No. 62/256,144 filed on Nov. 17, 2015, which is entirely incorporated herein by reference.

BACKGROUND

The invention relates to a clock data recovery scheme, and more particularly to a clock data recovery apparatus and corresponding frequency control circuit.

Generally speaking, a conventional clock data recovery device ideally can be adopted to track frequency offset for a data signal to lock the frequency of the data signal. The conventional clock data recovery device may include a single low-pass filter. However, practically, the conventional clock data recovery device is limited by the band width of its low-pass filter, process variation when manufacturing, and/or a severe environment condition such as rapid changes in temperature. For example, the conventional clock data recovery device inevitably cannot reduce more noise if the single low-pass filter is implemented with a wider bandwidth since the wider bandwidth can filter out less noise. However, if the single low-pass filter is implemented with a narrower band width, the conventional clock data recovery device certainly cannot track larger frequency offset of the data signal. This problem will become more critical if the conventional clock data recovery device is used in the severe environment condition.

SUMMARY

Therefore one of the objectives of the present invention is to provide a clock data recovery apparatus and corresponding frequency control circuit which include capabilities of reducing more noise as well as tracking larger frequency offset for an input data signal, to solve the above-mentioned problems.

According to embodiments of the present invention, a clock data recovery apparatus is disclosed. The clock data recovery apparatus comprises an oscillator, a sampler circuit, and a frequency control circuit. The oscillator is configured to generate a clock signal according to a bias voltage. The sampler circuit is coupled to the oscillator and configured to sample an input data signal to generate a sampling signal according to the clock signal. The frequency control circuit is coupled to the sampler circuit and the oscillator and configured to generate the bias voltage by performing integration calculation, digital-to-analog conversion, and low-pass filtering for the sampling signal.

In addition, according to the embodiments, the frequency control circuit is further disclosed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
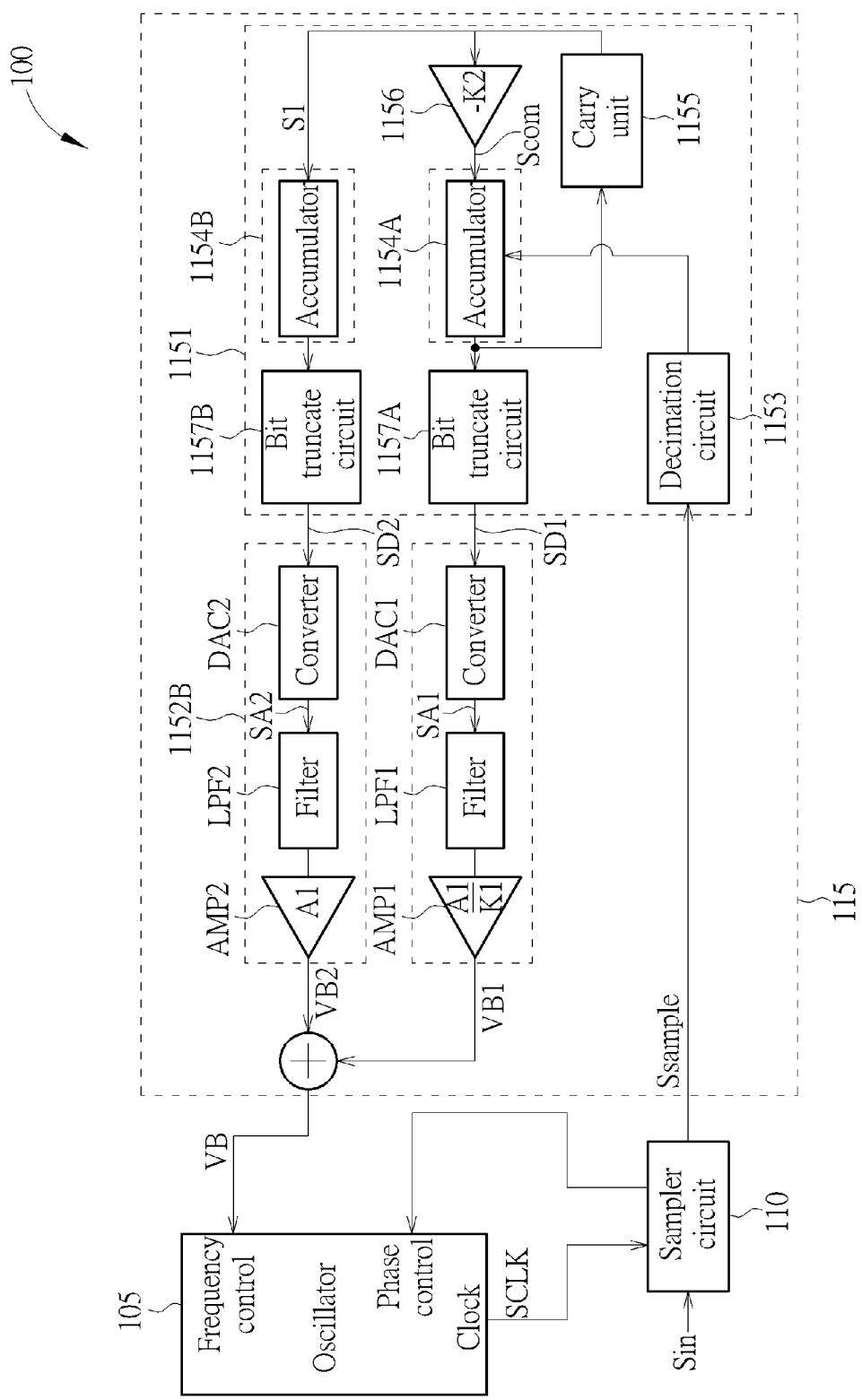
FIG. 1 is a block diagram of a clock data recovery apparatus according to a first embodiment of the invention.

Please refer to FIG. 1, which is a block diagram of a clock data recovery (CDR) apparatus 100 according to an embodiment of the invention. The apparatus 100 is capable of reducing noise as well as locking an input data signal Sin having larger frequency offsets compared to a clock signal generated by an oscillator. That is, the apparatus 100 is able to adopt/employ a wider tracking range to make the clock signal track a relatively wide frequency offset between the input data signal Sin and the clock signal, so as to achieve recovery of data clock. This clock data recovery scheme adopting the wider tracking range can be employed to track relatively wide frequency offsets caused by larger temperature changes. In addition, the apparatus 100 is also capable of reducing noise as far as possible.

In practice, as shown in FIG. 1, the apparatus 100 comprises an oscillator 105, a sampler circuit 110, and a frequency control circuit 115. The oscillator 105 is configured to generate a clock signal SCLK by referring to a bias voltage VB generated from the frequency control circuit 115. The bias voltage VB is used to control the frequency of clock signal SCLK generated by the oscillator 105. The sampler circuit 110 is coupled to the oscillator 105 and configured to sample the input data signal Sin to generate a sampling signal Ssample by using the clock signal SCLK generated by oscillator 105 wherein the sampling signal Ssample indicates lead/lag information between input data signal Sin and clock signal SCLK and the sampling signal Ssample is transmitted to the oscillator 105 for phase control. In addition, the sampling signal Ssample (including the lead/lag information) is transmitted to the frequency control circuit 115 for frequency control. The oscillator 105 is arranged to update phase and frequency of the clock signal SCLK by using the lead/lag information.

The frequency control circuit 115 is coupled to the sampler circuit 110 and the oscillator 105, and is configured to generate the bias voltage VB by performing at least integration calculation, digital-to-analog conversion, and low-pass filtering for the sampling signal Ssample on two different circuit paths.

In this embodiment, to track frequency offset/variation with a wider tracking range as well as reducing more noise as far as possible, the frequency control circuit 115 is arranged to generate the bias voltage VB by employing two different driving paths implemented with different gains and different low-pass filter band widths and then summing up the bias signals generated from the two different driving paths to generate the bias voltage VB. In practice, the frequency control circuit 115 comprises a controller 1151, a first driving circuit 1152A, and a second driving circuit 1152B. The controller 1151 is configured for at least performing the integration calculation based on the sampling signal Ssample to generate a first digital signal SD1 and a second digital signal SD2. The first driving circuit 1152A is coupled to the controller 1151 and comprises a digital-to-analog converter DAC1, a low-pass filter LPF1 implemented with first low-pass band width, and an amplifier AMP1 with a first gain value such as A1/K1. The first driving circuit 1152A is configured to generate a first analog signal SA1 with digital-to-analog conversion of DAC1 according to the first digital signal SD1, and is configured to generate a first bias voltage VB1 with the first low-pass band width and the first gain value according to the first analog signal SA1. The second driving circuit 1152B is coupled to the controller 1151 and comprises a digital-to-analog converter DAC2, a low-pass filter LPF2 implemented with second low-pass band width, and an amplifier AMP2 with a second gain value such as A1. The second driving circuit 1152B is configured to generate a second analog signal SA2 with second digital-to-analog conversion of DAC2 according to the second digital signal SD2, and is configured to generate a second bias voltage VB2 with the second low-pass band width and the second gain value according to the second analog signal SA2. The bias voltage VB is generated by the frequency control circuit 115 to sum up the first and second bias voltages VB1 and VB2. The implementations of converters DAC1 and DAC2 can be identical or can be different.

It should be noted that the first low-pass band width of LPF1 is different from the second low-pass band width of LPF2, and the first gain value is different from the second gain value. In this embodiment, the first low-pass band width is wider than the second low-pass band width, and the first gain value is smaller than the second gain value. The second low-pass band width of LPF2 can be configured to be narrower than quarter of first low-pass band width of LPF1. For example, the first low-pass band width of LPF1 can be designed to be almost 10 MHz while the second low-pass band width of LPF2 can be designed to be almost 50 KHz. The value K1 corresponding to first gain value A1/K1 can be configured as 4 at least. However, these examples are meant to be limitations of the invention. The first driving circuit 1152A with the wider first low-pass band width and smaller first gain value A1/K1 can be regarded as a fast tracking circuit path for frequency offset/variation, and the second driving circuit 1152B with the narrower second low-pass band width and larger second gain value A1 is regarded as a slow tracking circuit path for the frequency offset/variation. The fast tracking circuit path can be used to track frequency offset/variation from zero to +20/−20 percent, in response to different environment conditions such as different temperatures. In addition, with the design of wider low-pass band width and smaller gain value, noise can be significantly suppressed. The above-mentioned low-pass band widths and gain values can be adjusted when the apparatus 100 is produced, to meet different clock tracking requirements.

In practice, the controller 1151 comprises a decimation circuit 1153, a first integrator circuit 1154A, a carry unit 1155, an amplifier 1156, a second integrator circuit 1154B, and bit truncate circuits 1157A & 1157B. The first integrator circuit 1154A and second integrator circuit 1154B in this embodiment respectively comprises accumulators. The decimation circuit 1153 is arranged to perform decimation operation to reduce jitters of the sampling signal Ssample; the decimation circuit 1153 can be optional. The operation of decimation circuit 1153 can be bypassed. That is, in other embodiments, the decimation circuit 1153 can be excluded from the controller 1151. The first integrator circuit 1154A is configured to perform integration or accumulation to generate the first digital signal SD1 according to a compensating signal Scom and the sampling signal Ssample. Specifically, the first integrator circuit 1154A employs an accumulator to perform integration/accumulation for the compensating signal Scom and sampling signal Ssample to generate the first digital signal SD1, and then the first digital signal SD1 is further processed by the bit truncate circuit 1157A to reduce the number of bits for matching the requirement of converter DAC1. The carry unit 1155 (can be implemented by a circuit element and/or software) is coupled to an intermediate node between bit truncate circuit 1157A and first integrator circuit 1154A, and is configured to adaptively perform a carry operation to generate an output signal S1 according to the first digital signal SD1. In practice, the controller 1151 operates in digital domain, and the signal SD1 is digitally coded and represented by binary codes. The carry unit 1155 is arranged to copy important bit(s) or the most important bit of signal SD1 and take the bit(s) as important bit(s) or the most important bit of output signal S1, and take zero bit(s) as the other bit(s) of output signal S1. The carry function means that the carry unit 1155 is arranged to update information of the important bit(s) or the most important bit of output signal S1 once the accumulated value of signal SD1 exceeds above a specified limit. The amplifier 1156 is coupled to the carry unit 1155 and the first integrator circuit 1154A, and is configured to amplify the output signal S1 with a negative gain value to generate the compensating signal Scom for the first integrator circuit 1154A. The negative gain value is correspondingly configured as −K2 in response to the first gain value A1/K1 of amplifier AMP1. The absolute value of −K2 can be configured to be equal to or similar to the value K1; however, this is not a limitation of the invention. The second integrator circuit 1154B is configured to perform integration or accumulation to generate the second digital signal SD2 according to the output signal S1. Specifically, the second integrator circuit 1154B employs an accumulator to perform integration/accumulation for the output signal S1 to generate the second digital signal SD2, and then the second digital signal SD2 is further processed by the bit truncate circuit 1157B to reduce the number of bits for matching the requirement of converter DAC2. The bit truncate circuits 1157A and 1157B are optional.

By employing the carry unit 1155 and amplifier 1156, the value of first digital signal SD1 can be represented by a different form based on the carry calculation of carry unit 1155 to generate and transmit the output signal S1 on the different circuit path (slow tracking path), and then the value of first digital signal SD1 is compensated by the compensating signal Scom generated from the amplifier 1156 with negative gain value −K2. This permits the apparatus 100 to track the relatively large frequency offset/variation. That is, the tracking capability/range of apparatus 100 is outstanding compared to a conventional clock data recovery system.

Figure 2:
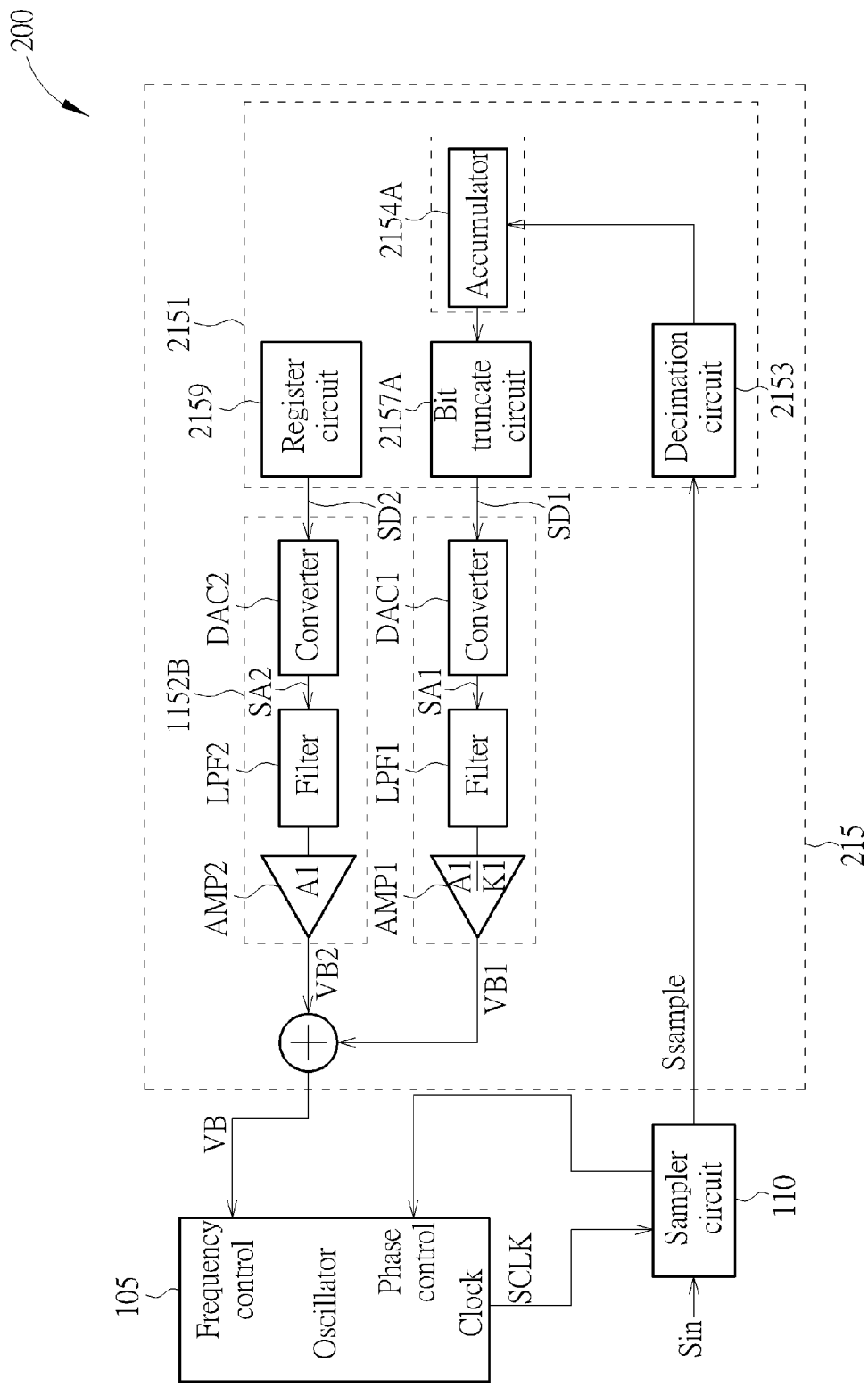
FIG. 2 is a block diagram of a clock data recovery apparatus according to a second embodiment of the invention.

In another embodiment, controller 115 can generate the first and second digital signals SD1 and SD2 by employing a single integrator circuit and a register circuit. Please refer to FIG. 2, which is a block diagram of a clock data recovery (CDR) apparatus 200 according to a second embodiment of the invention. The apparatus 200 is also capable of reducing noise as well as locking the input data signal Sin having larger frequency offsets compared to a clock signal generated by an oscillator. The apparatus 200 comprises the oscillator 105, the sampling circuit 110, and a frequency control circuit 215 including a controller 2151 and the driving circuits 1152A and 1152B. The controller 2151 comprises the decimation circuit 2153, an integrator circuit 2154, a bit truncate circuit 2157, and a register circuit 2159. The function and operation of decimation circuit 2153, integrator circuit 2154, and bit truncate circuit 2157 are identical to those of circuits including the same names as shown in FIG. 1, and are not detailed for brevity. The register circuit 2159 is arranged to provide and output a fixed value (represented by digital codes) as the second digital signal SD2 for the converter DAC2. The capability of frequency offset/variation tracking is provided by the circuit elements AMP1, LPF1, DAC1, bit truncate circuit 2157, and integrator circuit 2154 on the lower circuit path. The decimation circuit 2153 and bit truncate circuit 2157 are optional.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock data recovery apparatus, comprising:
   an oscillator, configured to generate a clock signal according to a bias voltage;
   a sampler circuit, coupled to the oscillator, configured to sample an input data signal to generate a sampling signal according to the clock signal; and
   a frequency control circuit, coupled to the sampler circuit and the oscillator, configured to generate the bias voltage by performing integration calculation, at least one digital-to-analog conversion, and low-pass filtering for the sampling signal;
   wherein the at least one digital-to-analog conversion comprise a first digital-to-analog conversion and a second digital-to-analog conversion, and the frequency control circuit comprises:
      a controller, configured for performing the integration calculation based on the sampling signal to generate a first digital signal and a second digital signal;
      a first driving circuit, coupled to the controller, configured to generate a first analog signal with the first digital-to-analog conversion according to the first digital signal, and configured to generate a first bias voltage with a first low-pass band width and a first gain value according to the first analog signal; and
      a second driving circuit, coupled to the controller, configured to generate a second analog signal with the second digital-to-analog conversion according to the second digital signal, and configured to generate a second bias voltage with a second low-pass band width and a second gain value according to the second analog signal;
      wherein the bias voltage is generated by the frequency control circuit to sum up the first and second bias voltages; the first low-pass band width is different from the second low-pass band width; and, the first gain value is different from the second gain value; and
   the controller comprises:
      a first integrator circuit, configured to perform integration/accumulation to generate the first digital signal;
      a carry circuit, coupled to an output of the first integrator circuit, configured to adaptively perform a carry operation to generate an output signal according to the first digital signal;
      an amplifier, coupled to the carry circuit and an input of the first integrator circuit, configured to amplify the output signal with a negative gain value to generate a compensating signal for the first integrator circuit; and
      a second integrator circuit, coupled to the carry circuit, configured to perform integration/accumulation to generate the second digital signal according to the output signal;
      wherein the first integrator circuit is arranged to perform the integration/accumulation to generate the first digital signal according to the compensating signal and the sampling signal.

2. The clock data recovery apparatus of claim 1, wherein the first low-pass band width is broader than the second low-pass band width; and the first gain value is smaller than the second gain value.

3. The clock data recovery apparatus of claim 1, wherein the controller further comprises:
   a decimation circuit, configured to perform decimation operation upon the sampling signal to generate a decimated sampling signal;
   wherein the first integrator circuit is arranged to perform the integration/accumulation to generate the first digital signal according to the compensating signal and the decimated sampling signal.

4. The clock data recovery apparatus of claim 1, wherein the negative gain value is equal to −K; the first gain value is equal to A'/K; and the second gain value is equal to A'.

5. A frequency control circuit for generating a bias voltage for an oscillator by performing integration calculation, at least one digital-to-analog conversion, and low-pass filtering for a sampling signal which is generated from sampling an input data signal by a sampler circuit according to a clock signal which is generated by the oscillator according to the bias voltage, the at least one digital-to-analog conversion comprising a first digital-to-analog conversion and a second digital-to-analog conversion, and the frequency control circuit comprising:
   a controller, configured for performing the integration calculation based on the sampling signal to generate a first digital signal and a second digital signal;
   a first driving circuit, coupled to the controller, configured to generate a first analog signal with the first digital-to-analog conversion according to the first digital signal, and configured to generate a first bias voltage with a first low-pass band width and a first gain value according to the first analog signal; and
   a second driving circuit, coupled to the controller, configured to generate a second analog signal with the second digital-to-analog conversion according to the second digital signal, and configured to generate a second bias voltage with a second low-pass band width and a second gain value according to the second analog signal;
   wherein the bias voltage is generated by the frequency control circuit to sum up the first and second bias voltages; the first low-pass band width is different from the second low-pass band width; and, the first gain value is different from the second gain value; and
   the controller comprises:
      a first integrator circuit, configured to perform integration/accumulation to generate the first digital signal;
      a carry circuit, coupled to an output of the first integrator circuit, configured to adaptively perform a carry operation to generate an output signal according to the first digital signal;
      an amplifier, coupled to the carry circuit and an input of the first integrator circuit, configured to amplify the output signal with a negative gain value to generate a compensating signal for the first integrator; and
      a second integrator circuit, coupled to the carry circuit, configured to perform integration/accumulation to generate the second digital signal according to the output signal;
      wherein the first integrator circuit is arranged to perform the integration/accumulation to generate the first digital signal according to the compensating signal and the sampling signal.

6. The frequency control circuit of claim 5, wherein the first low-pass band width is broader than the second low-pass band width; and the first gain value is smaller than the second gain value.

7. The frequency control circuit of claim 5, wherein the controller further comprises:
   a decimation circuit, configured to perform decimation operation upon the sampling signal to generate a decimated sampling signal;
   wherein the first integrator is arranged to perform the integration/accumulation to generate the first digital signal according to the adjusting signal and the decimated sampling signal.

8. The frequency control circuit of claim 5, wherein the negative gain value is equal to $-K2$; the first gain value is equal to $A1/K1$; and the second gain value is equal to $A1$.

* * * * *